United States Patent
Razavi et al.

(10) Patent No.: US 6,748,204 B1
(45) Date of Patent: Jun. 8, 2004

(54) MIXER NOISE REDUCTION TECHNIQUE

(75) Inventors: Behzad Razavi, Los Angeles, CA (US); Pengfei Zhang, Fremont, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 212 days.

(21) Appl. No.: 09/691,297

(22) Filed: Oct. 17, 2000

(51) Int. Cl.[7] .................................................. H04B 1/10
(52) U.S. Cl. ........................ 455/296; 455/323; 455/326; 455/330; 455/333; 327/355; 330/253; 330/254
(58) Field of Search ................................ 455/323, 326, 455/330, 333, 337; 327/355; 330/253, 254, 261, 252

(56) References Cited

U.S. PATENT DOCUMENTS

| | | | |
|---|---|---|---|
| 4,612,585 A | 9/1986 | Takase et al. ................ 358/316 |
| 4,766,497 A | 8/1988 | Banach et al. ............... 358/188 |
| 5,280,290 A | * 1/1994 | Evans .......................... 342/128 |
| 5,635,892 A | 6/1997 | Ashby et al. ................. 336/200 |
| 5,736,749 A | 4/1998 | Xie ................................. 257/3 |
| 5,745,838 A | 4/1998 | Tresness et al. .............. 455/5.1 |
| 6,008,102 A | 12/1999 | Alford et al. ................ 438/381 |
| 6,031,432 A | 2/2000 | Schreuders ................ 333/24 R |
| 6,057,714 A | * 5/2000 | Andrys et al. ............... 327/105 |
| 6,313,688 B1 | * 11/2001 | Lee et al. .................... 327/359 |
| 6,529,721 B1 | * 3/2003 | Tiller ........................... 455/323 |

OTHER PUBLICATIONS

Liu T. and Westerwick, E., "5–GHz CMOS Radio Transceiver Front–End Chipset", *IEEE Journal of Solid–State Circuits*, vol. 35, No. 12, Dec. 2000, pp. 1927–1941.

Steyaert et al., "A 2–V CMOS Cellular Transceiver Front-End", *IEEE Journal of Solid–State Circuits*, vol. 35, No. 12, Dec. 2000, pp. 1895–1907.

Lam, C. and Razavi, B., "A 2.6–GHz/5.2–GHz Frequency Synthesizer in 0.4–λm CMOS Tehnology", *IEEE Journal of Solid–State Circuits*, vol. 35,No. 5, May 2000, pp. 788–794.

Rategh et al., "A CMOS Frequency Synthesizer with an Injection–Locked Frequency Divider for a 5–GHz Wireless LAN Receiver", *IEEE Journal of Solid–State Circuits*, vol. 35, No. 5, May 2000, pp. 780–787.

Samavati et al., "A 5–GHz CMOS Wireless LAN Receiver Front End", *IEEE Journal of Solid–State Circuits*, vol. 35, No. 5, May 2000, pp. 765–772.

Wong et al., "A Wide Turning Range Gated Varactor", *IEEE Journal of Solid–State Circuits*, vol. 35, No. 5, May 2000, pp. 773–779.

* cited by examiner

*Primary Examiner*—Sinh Tran
*Assistant Examiner*—David Q Nguyen
(74) *Attorney, Agent, or Firm*—Withrow & Terranova, PLLC (57) ABSTRACT

In accordance with the present invention a mixer circuit noise reduction technique is provided. The mixer circuit of the present invention includes a gain stage for receiving a first signal and producing an output signal. The mixer circuit also includes a bias circuit coupled to the gain stage through a common node for providing a bias current to the gain stage, the bias circuit having an input for receiving a second signal, and in accordance therewith, varying the bias current. Additionally, the mixer circuit includes a frequency dependent current shunt circuit coupled between the common node and a reference voltage, wherein a first portion of the bias current frequency components within a first frequency range are coupled to the reference voltage by the shunt circuit, and a second portion of the bias current frequency components within a second frequency range are coupled to the reference voltage by the shunt circuit, the first portion being larger than the second portion. As a result, the noise in the mixer circuit is reduced while the gain is enhanced.

26 Claims, 7 Drawing Sheets

MIXER NOISE REDUCTION TECHNIQUE

BACKGROUND OF THE INVENTION

The present invention relates to mixer circuits and, more particularly, to a noise reduction technique for mixer circuits.

Mixer circuits, also known as modulator circuits, find many applications in electronic systems. For example, mixer circuits are widely used in wireless communication devices such as pagers and cellular phones to receive or transmit a modulated Radio Frequency (RF) signal. The function of a mixer circuit is to combine signals of two different frequencies in such a way as to produce energy at other frequencies. This function is typically achieved by designing a circuit that receives two input signals and produces an output that is product of the two inputs. The product of two periodic input signals will result in a modulated output signal as is well known in the art.

Figure 1:
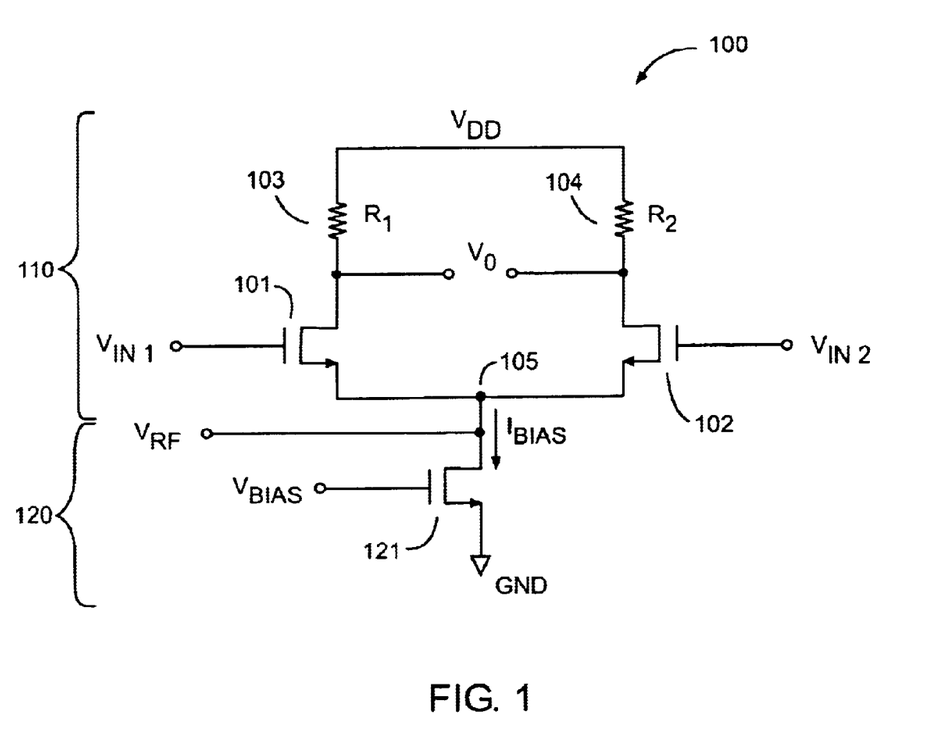
FIG. 1 illustrates one example of a mixer circuit for combining an RF signal and a differential input signal.

FIG. 1 illustrates a contemporary mixer circuit 100 for combining an RF signal and a differential input signal. The mixer circuit 100 of FIG. 1 includes a gain stage 110 and a bias circuit 120. The gain stage 110 of mixer circuit 100 receives a differential input signal ($V_{in1}$–$V_{in2}$) and produces a differential output signal $V_0$. The gain stage 110 includes a pair of NMOS transistors 101 and 102 with their sources coupled together at common node 105. The gain stage 110 also includes a pair of load resistors 103 and 104 connected between the drains of transistors 101 and 102 and a supply voltage $V_{dd}$ respectively. Bias circuit 120 of mixer circuit 100 includes an NMOS transistor 121 having an input to receive a bias voltage $V_{bias}$ to produce a bias current $I_{bias}$. Bias current $I_{bias}$ is coupled to the common node 105 to set the bias currents in transistors 101 and 102.

Mixer circuit 100 of FIG. 1 produces a modulated output by including an RF signal input to bias circuit 120. Bias circuit 120 receives an RF signal $V_{RF}$ at the drain of transistor 121. This signal has the effect of modulating the bias current $I_{bias}$. As $I_{bias}$ is modulated, the bias currents in transistors 101 and 102 are modulated, thereby varying the gain of gain stage 110 by an amount proportional to the amplitude of the RF signal. Accordingly, the output of mixer circuit 100 is the product of the differential input voltage ($V_{in1}$–$V_{in2}$) and the RF signal $V_{RF}$.

However, contemporary mixer circuits such as the one illustrated in FIG. 1 are often required to perform signal processing in environments that are very sensitive to the introduction of noise. For example, in a receiver the input signal may be very small (e.g. 10 microvolts). Accordingly, the receiver signal path requires high sensitivity, which in turn demands low noise. Therefore, a mixer circuit in the receiver signal path must minimize the amount of noise introduced into the system. Additionally, transmitted signals may be distorted by noise in the transmission signal path, and therefore can be more difficult to receive at the other end of the transmission medium. Likewise, signals input to a receiver may already be heavily distorted, and the introduction of additional noise may reduce the fidelity of the information contained in the signal.

Accordingly, a mixer circuit that reduces the amount of noise introduced into the signal path during either the reception or transmission of a signal is desired.

SUMMARY OF THE INVENTION

A mixer, in accordance with one embodiment of the present invention, includes a gain stage for receiving a first signal and a bias current, and in accordance therewith, producing an output signal. The gain stage receives the bias current on a common node. The bias circuit includes an input for receiving a second signal and an output coupled to the common node for providing the bias current to the gain stage, the bias current comprising bias current frequency components. The mixer also includes a frequency dependent current shunt circuit coupled between the common node and a reference voltage.

According to one embodiment, a first portion of the bias current frequency components within a first frequency range are coupled to the reference voltage by the shunt circuit, and a second portion of the bias current frequency components within a second frequency range are coupled to the reference voltage by the shunt circuit, the first portion being larger than the second portion.

According to one embodiment the frequency dependent current shunt circuit comprises an inductor having a first terminal coupled to the common node and a second terminal coupled to the reference voltage.

According to one embodiment, the bias circuit comprises a transistor having a control input and a first and second output, wherein the control input is coupled to a bias voltage, the first output is coupled to a second reference voltage, and the second output is coupled to the common node.

According to one embodiment, the differential stage comprises a first transistor having a control input and first and second outputs. The control input of the first transistor is coupled to receive a first component of the differential signal. The differential stage also comprises a second transistor having a control input and first and second outputs, the control input coupled to receive a second component of the differential signal. Further, the differential stage comprises a load coupled to the first output of the first transistor and to the first output of the second transistor, wherein the second output of the first transistor and the second output of the second transistor are coupled together and to the common node.

According to one embodiment, the present invention includes a method of reducing noise in a mixer circuit. The method comprises receiving a first signal in a gain stage, receiving a second signal in a bias circuit, generating a bias current in response to the second signal, the bias current having bias current frequency components including a frequency component at the first frequency, shunting a first portion of the bias current frequency components within a first frequency range to a reference voltage and a second portion of the bias current frequency components within a second frequency range to the reference voltage, the first frequency being in the second frequency range and the first portion being larger than the second portion, and coupling the bias current to the gain stage to produce a mixer output.

The following detailed description and the accompanying drawings provide a better understanding of the nature and advantages of the present invention.

DESCRIPTION OF THE SPECIFIC EMBODIMENTS

Figure 2:
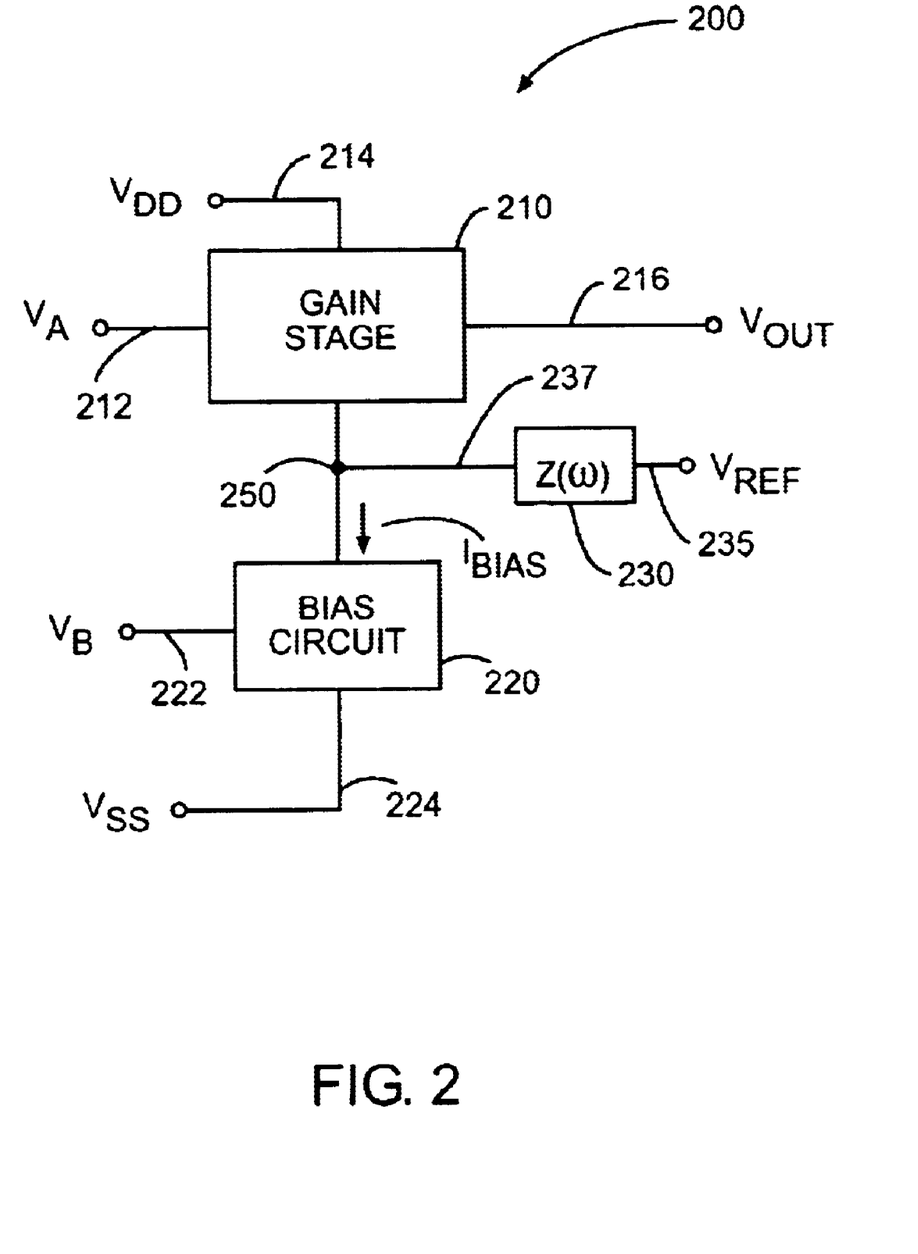
FIG. 2 illustrates a mixer circuit with a noise reduction technique according to one embodiment of the present invention.

FIG. 2 illustrates a mixer circuit 200 with a noise reduction technique according to one embodiment of the present invention. Mixer circuit 200 of FIG. 2 includes a gain stage 210, a bias circuit 220 and a frequency dependent current shunt circuit $Z(\omega)$ 230. Gain stage 210 receives an input signal $V_A$ on input node 212 and produces an output signal $V_{out}$ on output node 216. Additionally, gain stage 210 is powered by supply voltage $V_{dd}$ received on supply terminal 214.

Bias circuit 220 is coupled to common node 250 and to a second supply voltage $V_{ss}$. Bias circuit 220 also receives an input signal $V_B$ on input line 222 to produce a bias current $I_{bias}$. Bias current $I_{bias}$ is then coupled to common node 250 which is coupled to gain stage 210. Input signal $V_B$ may include both AC and DC frequency components. For example, the input signal to bias circuit 220 may include a DC bias voltage to generate a DC bias current component of $I_{bias}$, and a AC input signal to generate a primary AC bias current frequency component to be mixed with gain stage input signal $V_A$. In accordance with such components, bias circuit 220 will generate a bias current $I_{bias}$ with both AC and DC bias current frequency components. Therefore, it is to be understood that input signal $V_B$ is illustrative of one or more inputs to bias circuit 220. In one embodiment, input signal $V_B$ is a composite signal having both AC and DC components. In another embodiment, input signal $V_B$ comprises a first DC bias input signal line received by the bias circuit 220 for generating a DC bias current, and a second separate AC input signal line received by the bias circuit 220 for introducing AC bias current frequency components into the DC bias current.

Frequency dependent current shunt circuit $Z(\omega)$ 230 of FIG. 2 is coupled between the common node 250 and a reference voltage $V_{REF}$ 235. Shunt circuit $Z(\omega)$ 230 will shunt a portion of the bias current from bias circuit 220 to the reference voltage $V_{REF}$ depending on the frequency of the AC bias current frequency components. In one embodiment, the shunt circuit will couple a first portion of the bias current frequency components within a first frequency range to the reference voltage, and a second portion of the bias current frequency components within a second frequency range to the reference voltage. For example, across a range of lower frequencies, such as DC up to some frequency below the RF input signal frequency, a greater portion of the bias current is shunted to $V_{REF}$ than at high frequencies. On the other hand, across a range of high frequencies, such as some frequency sufficiently below the RF input signal frequency up to some frequency above the RF input frequency, only a small portion of the bias current (e.g. substantially zero) is shunted to the supply. Shunt circuit $Z(\omega)$ may also be conceptualized as a frequency dependent impedance. When the AC bias current frequency components are within a first low frequency range, the impedance of the shunt circuit is low, and a larger portion of the bias current is coupled to $V_{REF}$ than when the AC bias current frequency components of the bias current are within a second high frequency range, where the impedance of the shunt circuit $Z(\omega)$ is higher.

In accordance with the frequency dependent shunting of the bias current $I_{bias}$ from common node 250, there will be less bias current flowing through gain stage 210 at lower frequencies and more bias current flowing through gain stage 210 at higher frequencies. As a result, the noise introduced into the output signal $V_{out}$ by mixer circuit 200 is greatly reduced. Noise in the mixer circuit 200 is reduced because the noise in an integrated circuit device, such as a transistor, will increase as the operating currents of the device increase. Additionally, the noise in an integrated circuit device will decrease as the operating currents decrease. Therefore, the noise introduced into the output signal Vout by the gain stage 210 is reduced because at low frequencies, the devices in gain stage 210 are operating at lower operating currents, and therefore, generating less noise. Moreover, reducing the operating current also improves the gain of a given device. Therefore, by reducing the current in the gain stage at low frequencies, the shunt circuit $Z(\omega)$ also has the additional effect of improving the amount of gain in the gain stage. As a result, the mixer circuit provides an output with improved gain, but the noise introduced by noise components in bands below the AC bias frequency can be reduced.

The mixer circuit 200 illustrated by FIG. 2 shows that gain stage 200 is coupled to a first reference voltage (i.e. supply voltage Vdd) and bias circuit 220 is coupled to a second reference voltage (i.e. supply voltage Vss), such that Vdd>Vss. It is to be understood that Vss is a supply voltage below Vdd and may be at ground potential or some other positive or negative voltage. However, it is to be understood that other configurations for mixer circuit could be used. For example, in some embodiments gain stage 210 could be coupled to the more negative reference voltage and bias circuit 220 to the more positive reference voltage. Additionally, in other embodiments the more negative reference voltage could be ground voltage. Likewise, in other embodiments the more positive reference voltage could be ground voltage.

Figure 3:
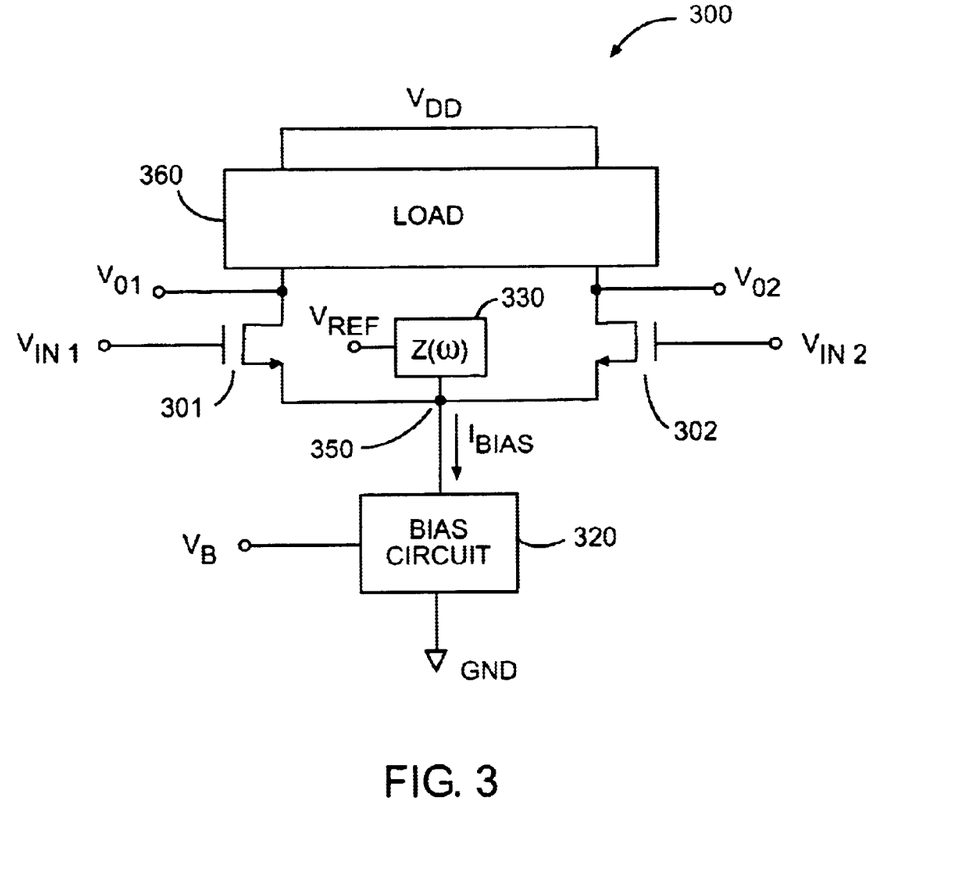
FIG. 3 illustrates a mixer circuit with a differential gain stage according to one embodiment of the present invention.

FIG. 3 illustrates a mixer circuit 300 with a differential gain stage according to one embodiment of the present invention. The differential gain stage of mixer circuit 300 includes a pair of input NMOS transistors 301 and 302 and a load 360. It is to be understood that in other embodiments, other transistors such as PMOS, NPN, PNP, or GaAs could also be used. The NMOS transistors 301 and 302 each have their gates coupled to receive an input signal, which in this case is a differential input signal comprised of $V_{in1}$ and $V_{in2}$. Additionally, the sources of transistors 301 and 302 are coupled together and to the common node 350. The drains of the transistors are connected to a load 360. The load 360 may be an active or passive load with a differential output, as shown, or a single ended output.

Bias circuit 320 is coupled between common node 350 and ground node ("GND") 324, and receives an input signal $V_B$ to generate a bias current $I_{bias}$. Input signal $V_B$ will typically include both AC and DC components, as mentioned previously. Bias current $I_{bias}$ is coupled to common node 350, and in accordance therewith, sets the bias currents in transistors 301 and 302. More particularly, when $V_{in1}=V_{in2}$, the bias current in transistors 301 and 302 is approximately equal.

Frequency dependent current shunt circuit $Z(\omega)$ 330 is coupled between common node 350 and a reference voltage $V_{REF}$. At low frequencies, shunt circuit 330 will shunt a greater portion of the bias current to $V_{REF}$ and away from transistors 301 and 302. However, at high frequencies, shunt circuit will shunt a lower portion of the bias current to $V_{REF}$. Therefore, more bias current will be provided to transistors 301 and 302 at the frequencies of interest, namely the frequency of the AC component of the bias circuit. This allows designers the ability to design a differential gain stage to run at higher bias currents and achieve greater gains without the noise penalty typically associated with high bias currents and large gains.

Figure 4:
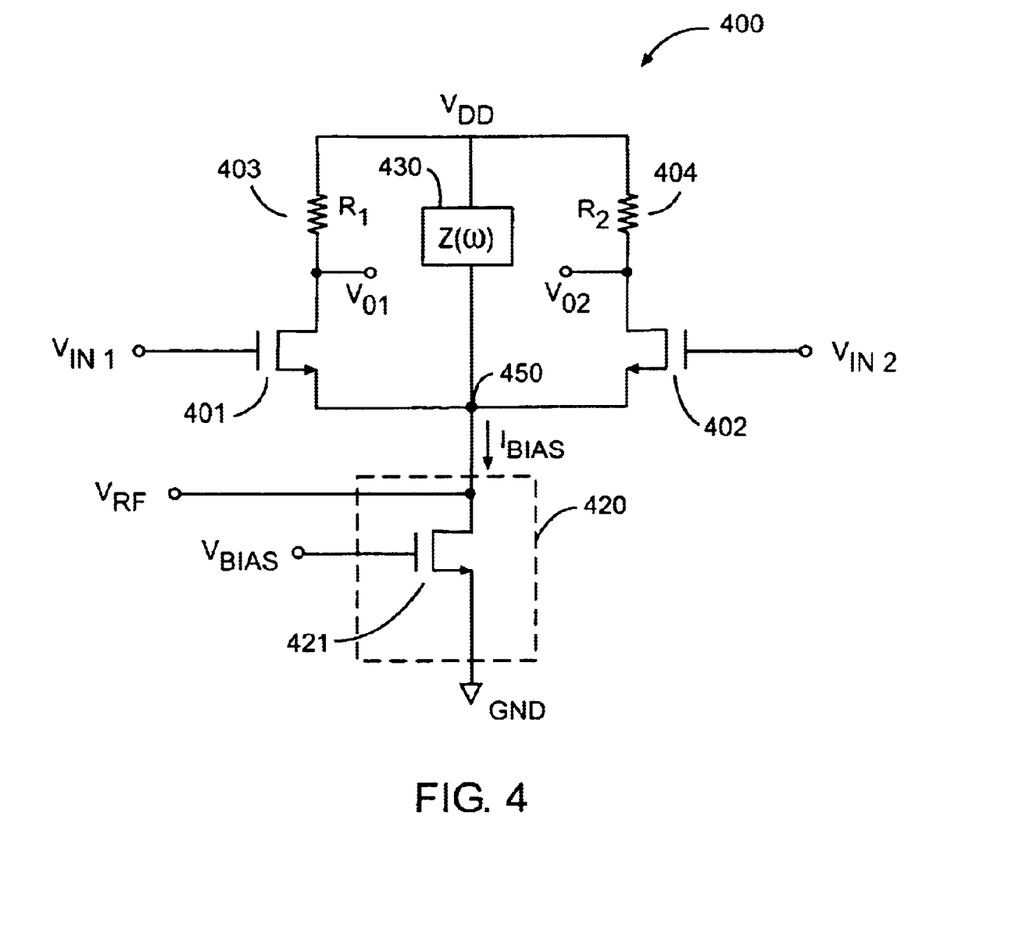
FIG. 4 illustrates another mixer circuit with a passive load in the gain stage and a transistor bias circuit according to one embodiment of the present invention.

FIG. 4 illustrates another mixer circuit 400 with a passive load in the gain stage and a transistor bias circuit 420 according to another embodiment of the present invention. The mixer circuit 400 of FIG. 4 includes a differential gain stage comprised of a pair of NMOS transistors 401 and 402 and a passive load circuit comprised of resistors 403 and 404. The gates of NMOS transistors 401 and 402 receive a differential input ($V_{in1}$–$V_{in2}$), and the output ($V_{o1-Vo2}$) is taken across their drains. Gain is provided by the action of the transistor drain currents with resistors 403 and 404, which are coupled between the drains of transistors 401 and 402 and supply voltage $V_{dd}$, respectively.

Bias circuit 420 comprises a single NMOS transistor 421. The gate of transistor 421 is coupled to a bias voltage $V_{bias}$ to generate a DC component of bias current $I_{bias}$ (not shown). The source of transistor 421 is coupled to ground voltage and the drain is coupled to common node 450. The drain is also coupled to a high frequency input signal $V_{RF}$, which modulates the bias current $I_{bias}$.

Mixer circuit 400 of FIG. 4 also includes a frequency dependent current shunt circuit $Z(\omega)$ 430 coupled between common node 450 and a reference voltage $V_{REF}$. At low frequencies, shunt circuit 430 will shunt a greater portion of the bias current to $V_{REF}$ and away from transistors 401 and 402. However, at high frequencies, shunt circuit will shunt a lower portion of the bias current to $V_{REF}$. Therefore, shunt circuit 430 can be designed to shunt bias current away from transistors 401 and 402 at frequencies below the frequency of input signal $V_{RF}$, thereby reducing the noise introduced into the signal path. However, at the frequency of interest, shunt circuit 430 will reduce the portion of bias current coupled to $V_{REF}$, and thereby increase the gain of the gain stage. Accordingly, the total broadband noise in the signal path is reduced and the gain of the mixer circuit increased.

Figure 5:
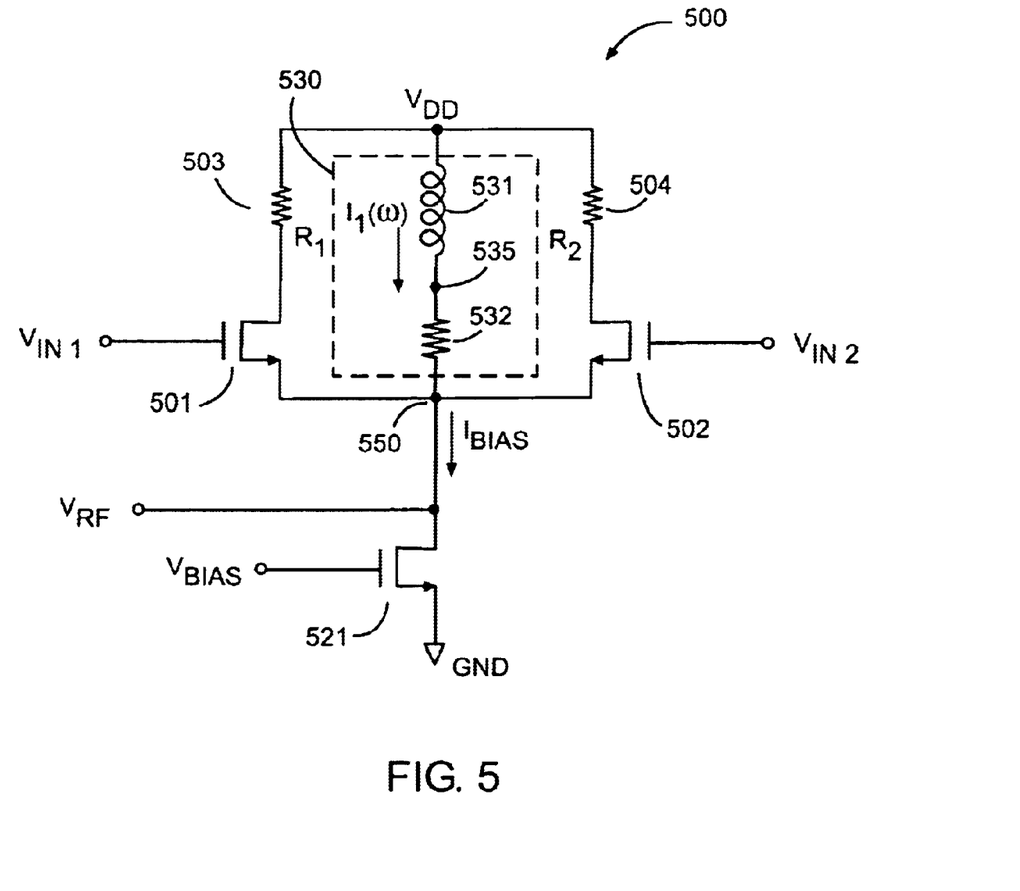
FIG. 5 illustrates another mixer circuit with a RL network according to one embodiment of the present invention.

FIG. 5 illustrates another mixer circuit 500 with a shunt circuit 530 including an RL network according to another embodiment of the present invention. Mixer circuit 500 includes a gain stage comprised of a pair of NMOS transistors 501 and 502 coupled to supply voltage $V_{dd}$ through a pair of load resistors 503 and 504, respectively. Mixer circuit 500 also includes a bias circuit comprised of NMOS transistor 521 having a gate coupled to a bias voltage $V_{bias}$, a source coupled to ground, and a drain coupled to common node 550 for coupling bias current $I_{bias}$ to the gain stage. The drain of transistor 521 is also coupled to input signal $V_{RF}$ to modulate $I_{bias}$.

Frequency dependent current shunt circuit 530 is coupled between common node 550 and a supply voltage Vdd. The shunt circuit 530 of the present embodiment is comprised of an inductor 531 and a resistor 532 coupled in series between the supply Vdd and the common node 550. A first terminal of the inductor 531 is coupled to the supply Vdd and a second terminal of the inductor is coupled to the resistor 532 at node 535. The resistor 532, in turn, is coupled between node 535 and common node 550.

At low frequencies, shunt circuit 530 will shunt a greater portion of the bias current to $V_{dd}$ and away from transistors 501 and 502. However, at high frequencies, shunt circuit will shunt a lower portion of the bias current to $V_{dd}$. This is illustrated by observing that at low frequencies, the inductor 531 is a short circuit, thus, shunt current $I_1(\omega)$ will be generated according to the difference between $V_{dd}$ and the voltage on the common node 550. Therefore, by choosing an appropriate value for resistor 532, the portion of the bias current $I_{bias}$ shunted to $V_{dd}$ at low frequency can be set to give a desired gain. Moreover, at high frequencies, the impedance of inductor 531 is higher. Accordingly, the shunt current $I_1(\omega)$ will begin to decrease. The values of the inductor 531 and resistor 532 can be chosen such that at the frequency of interest (i.e. the frequency of $V_{RF}$), the shunt current will be approximately zero or otherwise sufficiently reduced such that the bias current in transistors 501 and 502 produces the desired gain. Choosing appropriate values for the inductor and resistor would depend on the particular design parameters of the mixer and would be known by one skilled in the art in light of the teachings of this disclosure.

Figure 6:
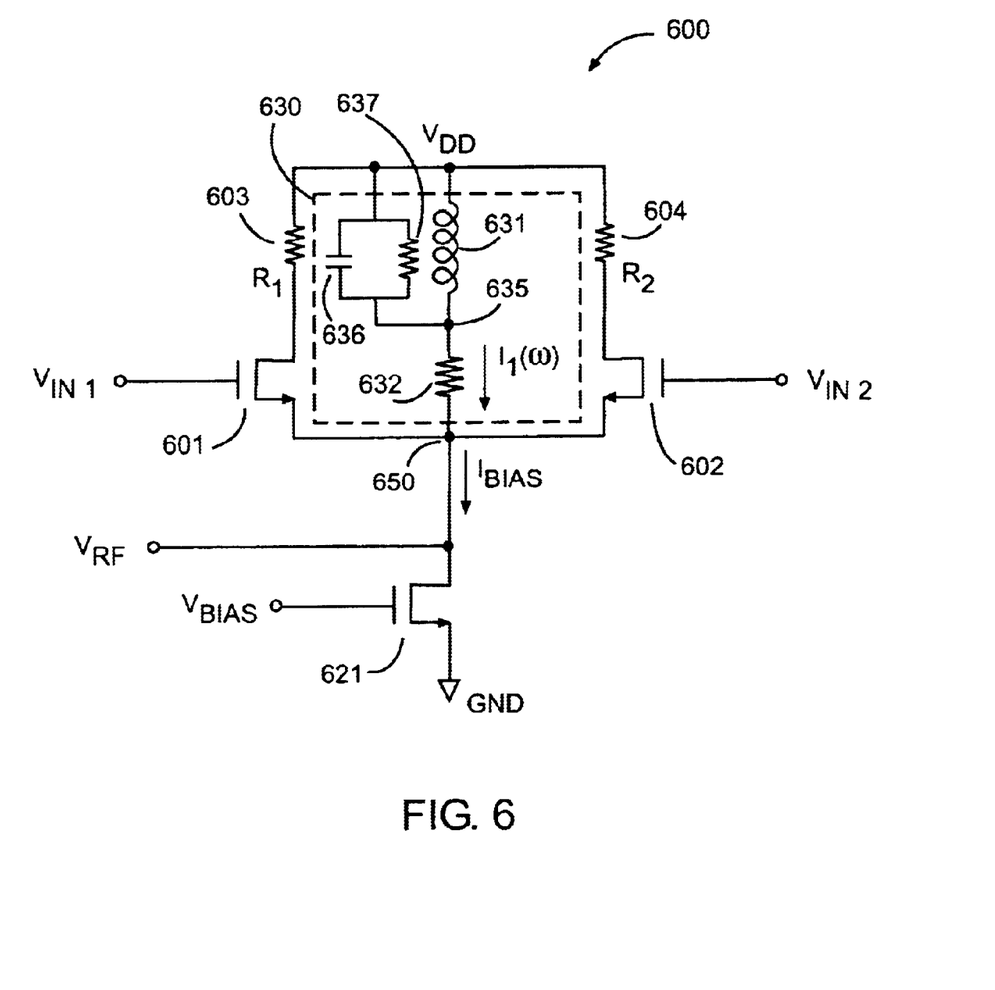
FIG. 6 illustrates another mixer circuit with an integrated inductor and parasitic elements according to one embodiment of the present invention.

FIG. 6 illustrates another mixer circuit 600 with an integrated inductor 631 and parasitic elements according to another embodiment of the present invention. Mixer circuit 600 includes a gain stage comprised of a pair of NMOS transistors 601 and 602 coupled to supply voltage $V_{dd}$ through a pair of load resistors 603 and 604, respectively. Mixer circuit 600 also includes a bias circuit comprised of NMOS transistor 621 having a gate coupled to a bias voltage $V_{bias}$, a source coupled to ground and a drain coupled to common node 650 for coupling bias current $I_{bias}$ to the gain stage. The drain of transistor 621 is also coupled to input signal $V_{RF}$ to modulate $I_{bias}$.

Mixer circuit 600 also includes a frequency dependent current shunt circuit 630 coupled between common node 650 and a supply voltage $V_{dd}$. The shunt circuit 630 is comprised of an integrated inductor 631 and an integrated resistor 632 coupled in series between the supply $V_{dd}$ and the common node 650. A first terminal of the inductor 631 is coupled to the supply $V_{dd}$ and a second terminal of the inductor is coupled to the resistor 632 at node 635. The resistor 632, in turn, is coupled between node 635 and common node 650. In one embodiment, the integrated inductor and resistor are fabricated on a substrate. The substrate may be a silicon substrate or other substrate useful for providing the inductor and/or resistor on a single integrated circuit or in a single integrated circuit package. The integrated inductor 631 of shunt circuit 630 includes parasitic elements. The parasitic elements include a parasitic capacitance 636 and a parasitic resistance 631 coupled in parallel with inductor 637 between supply voltage Vdd and node 635.

The existence of parasitic capacitance and inductance must be taken into account in order to guarantee that the appropriate amount of current is shunted to Vdd at the appropriate frequencies. Accordingly, Table 1 below illustrates one example of values that could be used for the passive and active devices included in mixer circuit 600 according to one embodiment of the present invention. The values in Table 1 are intended to be illustrative and not limiting.

TABLE 1

| Device | Parameter | Value |
| --- | --- | --- |
| NMOS transistor 601 | N * W/L | 8 * 1.25µ/180 n |
| NMOS transistor 602 | N * W/L | 8 * 1.25µ/180 n |
| NMOS transistor 621 | N * W/L | 4 * 2µ/180 n |
| Resistor R1 603 | R | 2 K |
| Resistor R2 604 | R | 2 K |
| Resistor 632 | R | 1 K |
| Inductor 631 | L | 14 nH |
| Parasitic Resistance 637 of Inductor 631 | R | 1.4 K |
| Parasitic Capacitance 636 of Inductor 631 | C | 65 fF |

Figure 7:
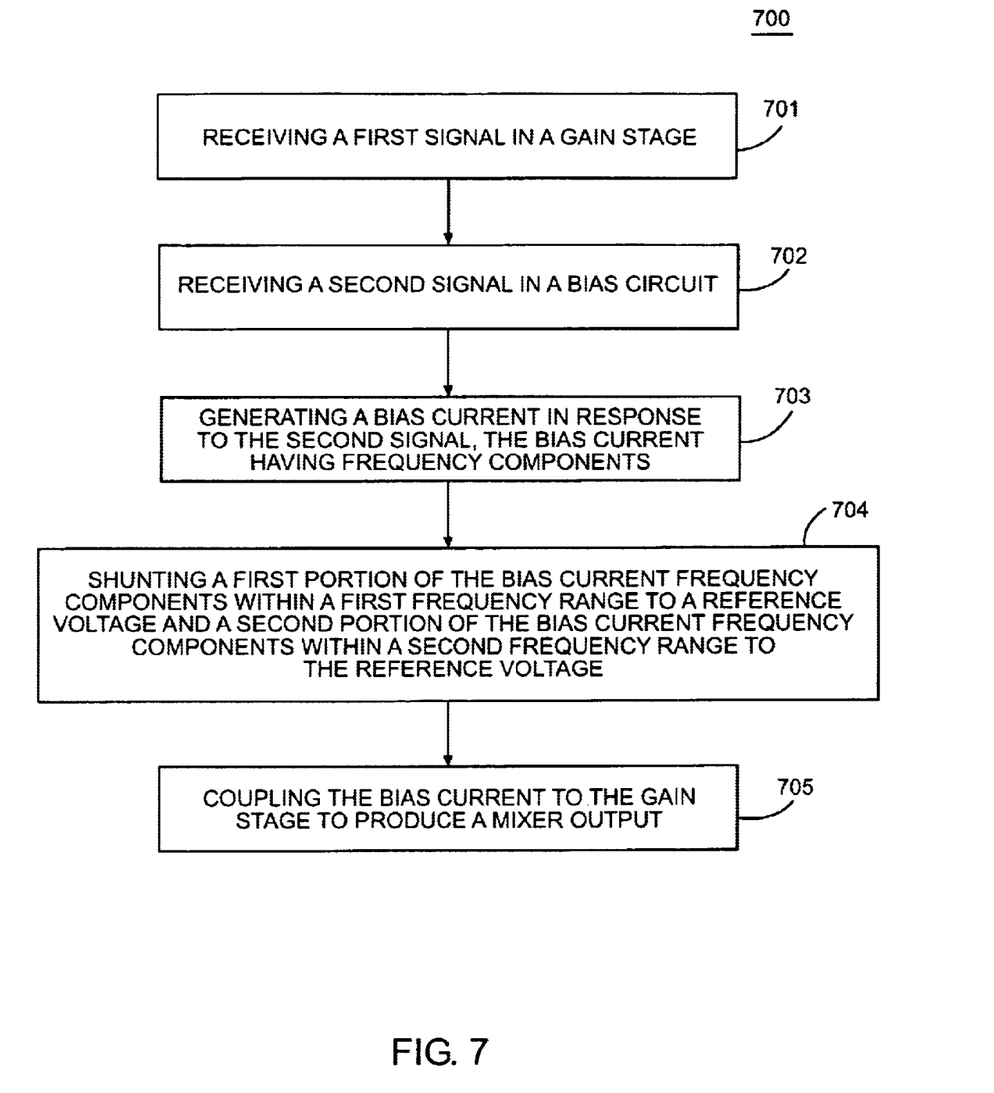
FIG. 7 shows a flow chart illustrating a method of reducing noise in a mixer circuit according to one embodiment of the present invention.

FIG. 7 shows a flow chart 700 illustrating a method of reducing noise in a mixer circuit according to one embodiment of the present invention. According to the method illustrated in FIG. 7, a first signal is received in a gain stage at 701. Additionally, a second signal is received in a bias circuit at 702. At 703 a bias current having bias current frequency components is generated in response to the second signal. At 704, a first portion of the bias current frequency components within a first frequency range are shunted to a reference voltage, and a second portion of the bias current frequency components within a second frequency range are shunted to the reference voltage. The first portion of bias current frequency components shunted to the reference voltage may be larger than the second portion. For example, a larger portion of the bias current from DC to some frequency below the frequency of the first and second input signals is shunted to the reference voltage, and a smaller portion of the bias current from some frequency below the input signal frequencies to some frequency above the input signal frequencies is shunted to the reference voltage. At 705, the bias current is coupled to the gain stage to produce a mixer output. The mixer output will typically be proportional to the product of the first and second signals.

It is to be understood that a person skilled in the art, in light of the detailed description above, would understand that the particular portions of bias current shunted using the frequency dependent shunt circuit can be adjusted to meet the particular requirements of a design while gaining the advantages of the present invention. For example, in one embodiment, the second portion of bias current frequency components shunted at higher frequencies is substantially zero. Moreover, a person skilled in the art would also understand how to manipulate the embodiments presented above to modify the first and second frequency ranges to meet the requirements of a particular design. For example, in one embodiment the mixer circuit is used as a demodulator. Accordingly, the first input signal frequency may be 5 GHz. Additionally, the second input signal frequency may be a 5 GHz carrier with a 1 MHz sideband. Accordingly, one skilled in the art could design first and second frequency ranges of the frequency dependent shunt circuit to pass the 1 MHz signal to the output.

Having fully described alternative embodiments of the present invention, other equivalent or alternative techniques for reducing noise in a mixer circuit according to the present invention will be apparent to those skilled in the art. For example, while the present invention was primarily described in connection with a NMOS differential amplifier, the present invention can be used for other amplifier structures which receive a signal to be modulated on a common node that sets the bias of the gain stage of the mixer. Additionally, other devices such as bipolar transistors or gallium arsenide transistors may be used in equivalent structures without departing from the spirit and scope of the present invention. These equivalents and alternatives along with the understood obvious changes and modifications are intended to be included within the scope of the present invention as defined by the following claims.

What is claimed is:

1. A mixer circuit comprising:
a gain stage configured to receive a first signal and a bias current, and in accordance therewith, produce an output signal, the gain stage receiving the bias current on a common node;
a bias circuit having an input configured to receive a second signal and an output coupled to the common node to provide the bias current to the gain stage, the bias current comprising bias current frequency components; and
a frequency dependent current shunt circuit coupled between the common node and a reference voltage, wherein a first portion of the bias current frequency components within a first frequency range are coupled to the reference voltage by the shunt circuit, and a second portion of the bias current frequency components within a second frequency range are coupled to the reference voltage by the shunt circuit, the first portion being larger than the second portion,
wherein the second frequency range is higher than the first frequency range.

2. The mixer circuit of claim 1 wherein the second signal generates a first frequency component in the bias current, the first frequency component being within the second frequency range.

3. The mixer circuit of claim 1 wherein the bias current received by the gain stage is reduced, and in accordance therewith, noise in the output signal is reduced.

4. The mixer circuit of claim 1 wherein the second signal includes an RF frequency and the second frequency range is a high frequency range, the RF frequency of the second signal being within the high frequency range.

5. The mixer circuit of claim 1 wherein the second portion of the frequency components coupled to the reference voltage by the shunt circuit is substantially zero.

6. The mixer circuit of claim 1 wherein the frequency dependent current shunt circuit comprises an inductor having a first terminal coupled to the common node and a second terminal coupled to the reference voltage.

7. The mixer circuit of claim 6 wherein the frequency dependent current shunt circuit further comprises a resistor coupled between the common node and the first terminal of the inductor.

8. The mixer circuit of claim 1 wherein the bias circuit comprises a transistor having a control input and a first and second output, wherein the control input is coupled to a bias voltage, the first output is coupled to a second reference voltage, and the second output is coupled to the common node.

9. The mixer circuit of claim 8 wherein the second output of the transistor is coupled to receive the second signal.

10. The mixer circuit of claim 8 wherein the transistor is an NMOS transistor.

11. The mixer circuit of claim 1 wherein the gain stage is a differential stage and the first signal is a differential signal.

12. The mixer circuit of claim 11 wherein the differential stage comprises:
a first transistor having a control input and first and second outputs, the control input coupled to receive a first component of the differential signal;

a second transistor having a control input and first and second outputs, the control input coupled to receive a second component of the differential signal; and a load coupled to the first output of the first transistor and to the first output of the second transistor, wherein the second output of the first transistor and the second output of the second transistor are coupled together and to the common node.

13. The mixer circuit of claim 12 wherein the first and second transistors are NMOS transistors.

14. The mixer circuit of claim 12 wherein the load comprises a first resistor coupled between the first output of the first transistor and a supply voltage and a second resistor coupled between the first output of the second transistor and the supply voltage.

15. The mixer circuit of claim 1 wherein the reference voltage is a supply voltage.

16. A mixer circuit comprising:

first and second transistors configured to receive a differential input signal, the first and second transistors coupled to a common node to receive a bias current;

a third transistor having a bias output coupled to the common node, the third transistor coupled to receive an RF signal and generate a bias current at the bias output; and an inductor having a first terminal coupled to the common node and a second terminal coupled to a supply voltage;

wherein the bias current comprises bias frequency components, and a frequency dependent current shunt circuit couples a first portion of the bias current frequency components within a first frequency range to the supply voltage, and couples a second portion of the bias current frequency components within a second frequency range to the supply voltage, the first portion being larger than the second portion.

17. The mixer circuit of claim 16 further comprising a first resistor coupled between the first transistor and the supply voltage and a second resistor coupled between the second transistor and the supply voltage.

18. The mixer circuit of claim 16 further comprising a resistor coupled between the common node and the first terminal of the inductor.

19. The mixer circuit of claim 16 wherein the inductor is integrated on a semiconductor substrate and includes a parasitic capacitance coupled between the inductor and the supply voltage.

20. The mixer circuit of claim 16 wherein the inductor is integrated on a semiconductor substrate and includes a parasitic resistance coupled between the first terminal of the inductor and the supply voltage.

21. The mixer circuit of claim 16 wherein the RF signal is coupled to the bias output and to the common node.

22. The mixer circuit of claim 16 wherein the first, second, and third transistors are NMOS transistors.

23. A method of reducing noise in a mixer comprising:

receiving a first signal in a gain stage;

receiving a second signal in a bias circuit, the second signal having a first frequency;

generating a bias current in response to the second signal, the bias current having bias current frequency components including a frequency component at the first frequency;

shunting a first portion of the bias current frequency components within a first frequency range to a reference voltage and a second portion of the bias current frequency components within a second frequency range higher than the first frequency range to the reference voltage, the first frequency being in the second frequency range and the first portion being larger than the second portion; and coupling the bias current to the gain stage to produce a mixer output.

24. The method of claim 23 wherein the first frequency is an RF frequency.

25. The method of claim 23 wherein the second portion of the bias current frequency components is substantially zero at the first frequency.

26. The method of claim 23 wherein the mixer output is proportional to the product of the first signal and the second signal.

* * * * *